US009538689B2

(12) United States Patent
Dasario et al.

(10) Patent No.: US 9,538,689 B2
(45) Date of Patent: *Jan. 3, 2017

(54) DATA CENTER COOLING WITH CRITICAL DEVICE PRIORITIZATION

(71) Applicant: GLOBALFOUNDRIES Inc., Grand Cayman (KY)

(72) Inventors: Shiva R. Dasario, Austin, TX (US); Raghuswamyreddy Gundam, Austin, TX (US); Newton P. Liu, Austin, TX (US); Douglas W. Oliver, Round Rock, TX (US); Wingcheung Tam, Austin, TX (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 668 days.

This patent is subject to a terminal disclaimer.

(21) Appl. No.: 14/036,665

(22) Filed: Sep. 25, 2013

(65) Prior Publication Data

US 2015/0088319 A1 Mar. 26, 2015

(51) Int. Cl.
*G06F 19/00* (2011.01)
*H05K 7/20* (2006.01)

(52) U.S. Cl.
CPC .................. *H05K 7/20836* (2013.01)

(58) Field of Classification Search
CPC ................................................ H05K 7/20836
See application file for complete search history.

(56) References Cited

U.S. PATENT DOCUMENTS

| 8,290,629 B1* | 10/2012 | Mateski | H05K 7/20836 137/2 |
| 8,478,451 B2 | 7/2013 | Li et al. | |
| 2003/0193777 A1* | 10/2003 | Friedrich | G06F 1/206 361/679.53 |
| 2007/0260417 A1* | 11/2007 | Starmer | G01K 7/425 702/136 |
| 2007/0300083 A1* | 12/2007 | Goodrum | G06F 1/3203 713/300 |
| 2009/0044027 A1 | 2/2009 | Piazza | |

(Continued)

OTHER PUBLICATIONS

Bash, Cullen, and George Forman. "Cool Job Allocation: Measuring the Power Savings of Placing Jobs at Cooling-Efficient Locations in the Data Center." USENIX Annual Technical Conference. vol. 138. 2007.*

(Continued)

*Primary Examiner* — Michael D Masinick
(74) *Attorney, Agent, or Firm* — Heslin Rothenberg Farley & Mesiti P.C.

(57) ABSTRACT

A method and/or computer program product automatically adjusts room temperature in a data center room. A processor in a heating, ventilation and air conditioning (HVAC) system receives a throttle threshold temperature for each of multiple computing devices that are within a data center room, which is climate-controlled by the HVAC system. The processor in the HVAC system monitors a real-time temperature of at least one of the multiple computing devices. In response to the real-time temperature of said at least one of the multiple computing devices exceeding the throttle threshold temperature, an ambient air temperature in the data center room is decreased by adjusting a hardware thermostat in the HVAC system.

13 Claims, 4 Drawing Sheets

(56) References Cited

U.S. PATENT DOCUMENTS

| | | | |
|---|---|---|---|
| 2010/0131109 A1 | 5/2010 | Rasmussen et al. | |
| 2011/0153798 A1* | 6/2011 | Groenendaal | H04L 63/20 709/223 |
| 2012/0254400 A1 | 10/2012 | Iyengar et al. | |
| 2012/0331317 A1 | 12/2012 | Rogers et al. | |
| 2013/0138253 A1 | 5/2013 | Chainer et al. | |
| 2014/0011437 A1* | 1/2014 | Gosselin | H05K 7/20836 454/154 |
| 2015/0088314 A1* | 3/2015 | Dasari | H05K 7/20836 700/276 |
| 2015/0355699 A1* | 12/2015 | Castro-Leon | G06F 1/30 713/322 |
| 2015/0370294 A1* | 12/2015 | Busch | G06F 1/206 713/322 |

OTHER PUBLICATIONS

Moore, Justin D., et al. "Making Scheduling "Cool": Temperature-Aware Workload Placement in Data Centers." USENIX annual technical conference, General Track. 2005.*

Tang, Qinghui, Sandeep KS Gupta, and Georgios Varsamopoulos. "Thermal-aware task scheduling for data centers through minimizing heat recirculation." Cluster Computing, 2007 IEEE International Conference on. IEEE, 2007.*

Anonymous, "Smart Cooling Solutions Data Center: Solutions for a Future-Proof Data Center", Emerson Network Power, Oct. 2012, pp. 1-100.

R. Miller, "Facebook Seeks Patent on Cooling Automation", Datacenterknowledge.com, March 5, 2012, pp. 1-4.

G. Shields, "Tip 10—Turn Up the Thermostat in Your Data Center", Realtime Publishers, 2013, 1 Page.

* cited by examiner

DATA CENTER COOLING WITH CRITICAL DEVICE PRIORITIZATION

BACKGROUND

The present disclosure relates to the field of computing devices, and specifically to the computing devices that operate within a data center. Still more particularly, the present disclosure relates to optimizing the temperature of the data center room for efficient cooling of the computing devices.

Computing devices include personal computers, servers, blade servers, blade server chasses that hold multiple blade servers, etc. Such computing devices have cooling requirements that, if not met, will result in a reduction in operations ("throttling") and/or damage to the computer devices.

SUMMARY

In one embodiment of the present invention, a method and/or computer program product automatically adjusts room temperature in a data center room. A processor in a heating, ventilation and air conditioning (HVAC) system receives a throttle threshold temperature for each of multiple computing devices, wherein the multiple computing devices are physically located within a data center room that is climate-controlled by the HVAC system, wherein the throttle threshold temperature is a temperature that, if exceeded, causes operations of one or more components of a computing device to be reduced, and wherein the throttle threshold temperature is provided by a hardware management module (MM) associated with at least one of the multiple computing devices. The processor in the HVAC system monitors a real-time temperature of at least one of the multiple computing devices, wherein the real-time temperature is provided by the hardware MM associated with said at least one of the multiple computing devices. In response to the real-time temperature of said at least one of the multiple computing devices exceeding the throttle threshold temperature for said at least one of the multiple computing devices, an ambient air temperature in the data center room is decreased by adjusting a hardware thermostat in the HVAC system.

In one embodiment of the present invention, a system comprises: a heating, ventilation and air conditioning (HVAC) system, wherein the HVAC system comprises: a hardware control agent for: receiving a throttle threshold temperature for each of multiple computing devices, wherein the multiple computing devices are physically located within a data center room that is climate-controlled by the HVAC system, wherein the throttle threshold temperature is a temperature that, if exceeded, causes operations of one or more components of a computing device to be reduced, and wherein the throttle threshold temperature is provided by a hardware management module (MM) associated with at least one of the multiple computing devices; monitoring a real-time temperature of at least one of the multiple computing devices, wherein the real-time temperature is provided by the hardware MM associated with said at least one of the multiple computing devices; and a hardware thermostat, wherein the hardware thermostat, in response to the real-time temperature of said at least one of the multiple computing devices exceeding the throttle threshold temperature for said at least one of the multiple computing devices, decreases an ambient air temperature in the data center room by adjusting the HVAC system.

DETAILED DESCRIPTION

Figure 1:
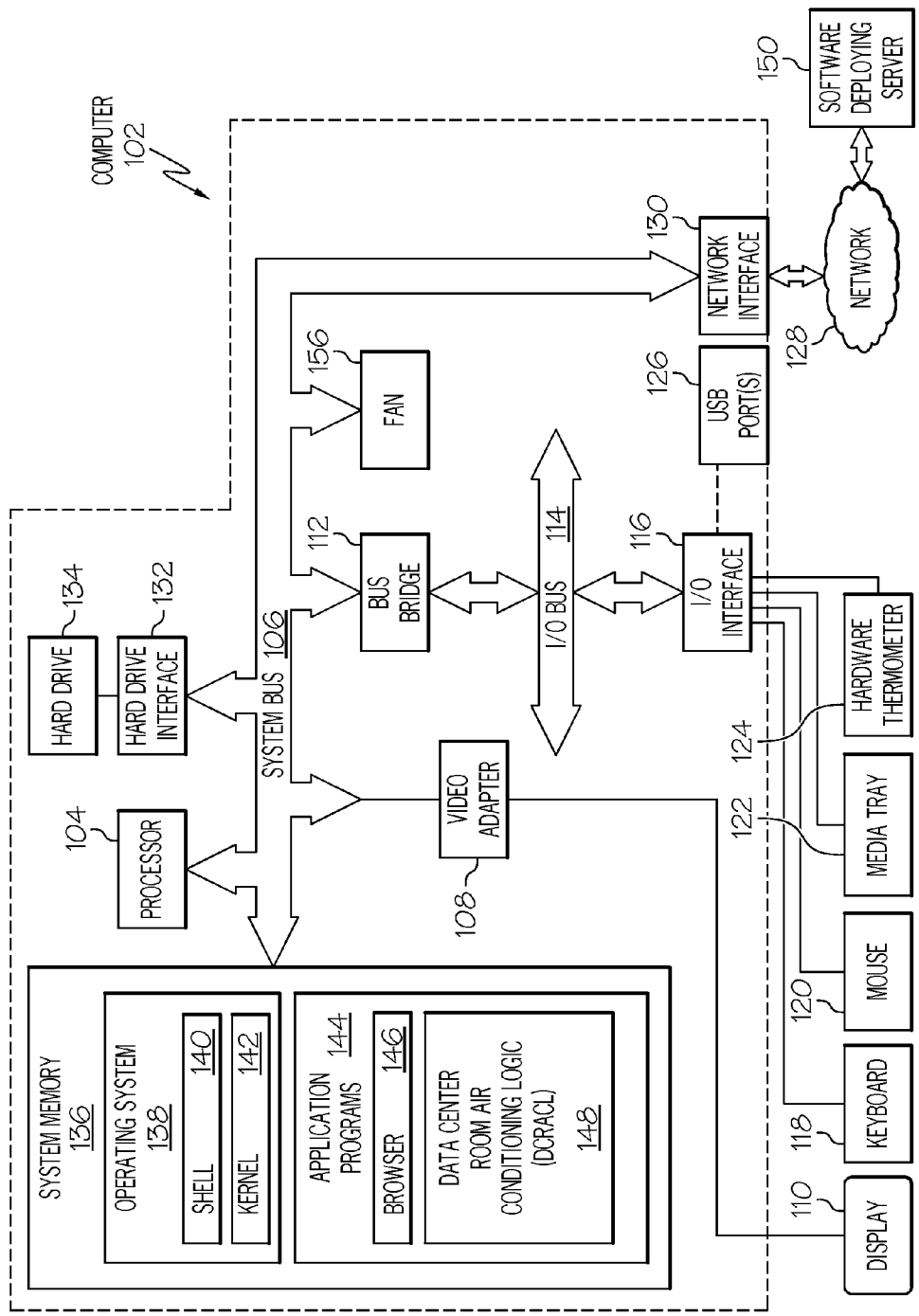
FIG. 1 depicts an exemplary system and network which may be used to implement the present invention.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including, but not limited to, wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

With reference now to the figures, and in particular to FIG. 1, there is depicted a block diagram of an exemplary system and network that may be utilized by and/or in the implementation of the present invention. Note that some or all of the exemplary architecture, including both depicted hardware and software, shown for and within computer 102 may be utilized by software deploying server 150; as well as blades 204x-204z, chassis management modules 206x-206y, blade management modules 210a-210c, and/or control agent 211 depicted in FIG. 2.

Exemplary computer 102 includes a processor 104 that is coupled to a system bus 106. Processor 104 may utilize one or more processors, each of which has one or more processor cores. A video adapter 108, which drives/supports a display 110, is also coupled to system bus 106. System bus 106 is coupled via a bus bridge 112 to an input/output (I/O) bus 114. An I/O interface 116 is coupled to I/O bus 114. I/O interface 116 affords communication with various I/O devices, including a keyboard 118, a mouse 120, a media tray 122 (which may include storage devices such as CD-ROM drives, multi-media interfaces, etc.), a hardware thermometer 124, and external USB port(s) 126. While the format of the ports connected to I/O interface 116 may be any known to those skilled in the art of computer architecture, in one embodiment some or all of these ports are universal serial bus (USB) ports.

As depicted, computer 102 is able to communicate with a software deploying server 150 using a network interface 130. Network interface 130 is a hardware network interface, such as a network interface card (NIC), etc. Network 128 may be an external network such as the Internet, or an internal network such as an Ethernet or a virtual private network (VPN).

Furthermore, in an embodiment in which the computers/devices are mobile devices, network 128 is a wireless network. Examples of such as wireless network include, but are not limited to, a near field communication (NFC) network (in which devices communicate at ranges of 4 cm or less); personal area networks (PANs), such as those that use industrial, scientific, and medical (ISM) radio bands and protocols defined in the Institute of Electrical and Electronics Engineers (IEEE) 802.15.1 standard for wireless communications within a few meters; and/or a Wi-Fi network, which enables wireless communication in a range of approximately 100 meters in accordance with the IEEE 802.11x standards.

A hard drive interface 132 is also coupled to system bus 106. Hard drive interface 132 interfaces with a hard drive 134. In one embodiment, hard drive 134 populates a system memory 136, which is also coupled to system bus 106. System memory is defined as a lowest level of volatile memory in computer 102. This volatile memory includes additional higher levels of volatile memory (not shown), including, but not limited to, cache memory, registers and buffers. Data that populates system memory 136 includes computer 102's operating system (OS) 138 and application programs 144.

OS 138 includes a shell 140, for providing transparent user access to resources such as application programs 144. Generally, shell 140 is a program that provides an interpreter and an interface between the user and the operating system. More specifically, shell 140 executes commands that are entered into a command line user interface or from a file. Thus, shell 140, also called a command processor, is generally the highest level of the operating system software hierarchy and serves as a command interpreter. The shell provides a system prompt, interprets commands entered by keyboard, mouse, or other user input media, and sends the interpreted command(s) to the appropriate lower levels of the operating system (e.g., a kernel 142) for processing. Note that while shell 140 is a text-based, line-oriented user interface, the present invention will equally well support other user interface modes, such as graphical, voice, gestural, etc.

As depicted, OS 138 also includes kernel 142, which includes lower levels of functionality for OS 138, including providing essential services required by other parts of OS 138 and application programs 144, including memory management, process and task management, disk management, and mouse and keyboard management.

Application programs 144 include a renderer, shown in exemplary manner as a browser 146. Browser 146 includes program modules and instructions enabling a world wide web (WWW) client (i.e., computer 102) to send and receive network messages to the Internet using hypertext transfer protocol (HTTP) messaging, thus enabling communication with software deploying server 150 and/or other computer systems.

Application programs 144 in computer 102's system memory (as well as software deploying server 150's system memory) also include a data center room air conditional logic (DCRACL) 148. DCRACL 148 includes code for implementing the processes described below, including those described and/or referenced in FIGS. 2-4. In one embodiment, computer 102 is able to download DCRACL 148 from software deploying server 150, including in an on-demand basis, wherein the code in DCRACL 148 is not downloaded until needed for execution. Note further that, in one embodiment of the present invention, software deploying server 150 performs all of the functions associated with the present invention (including execution of DCRACL 148), thus freeing computer 102 from having to use its own internal computing resources to execute DCRACL 148.

Also within computer 102 is a fan 156. Fan 156 is a mechanical air-mover, made up of a motor and propeller/impeller that provide airflow across some or all of the components depicted within computer 102.

Note that the hardware elements depicted in computer 102 are not intended to be exhaustive, but rather are representative to highlight essential components required by the present invention. For instance, computer 102 may include alternate memory storage devices such as magnetic cassettes, digital versatile disks (DVDs), Bernoulli cartridges, and the like. These and other variations are intended to be within the spirit and scope of the present invention.

Figure 2:
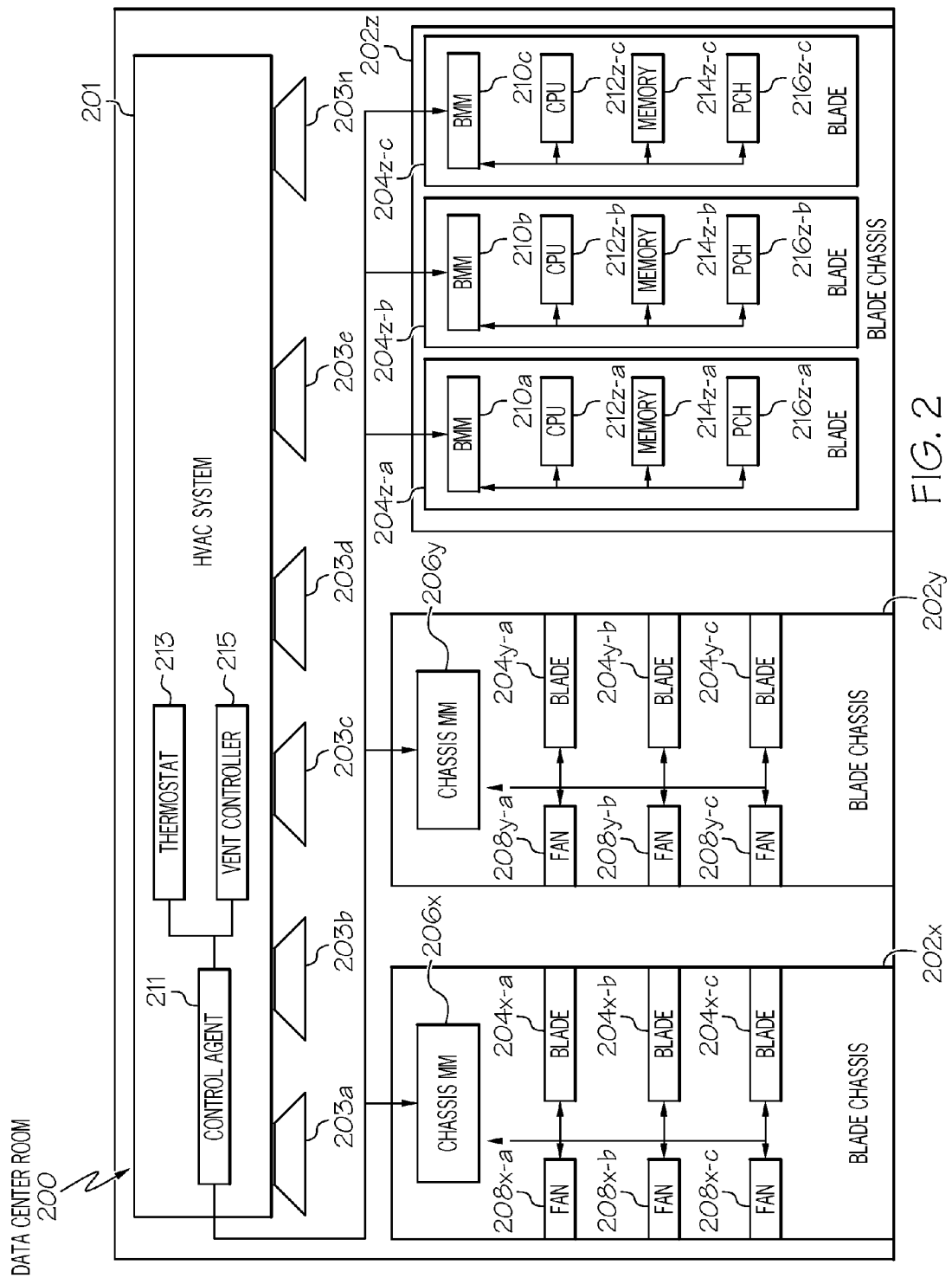
FIG. 2 depicts an exemplary data center room in which the present invention may be implemented/utilized.

With reference now to FIG. 2, an exemplary data center room 200 in which the present invention may be implemented/utilized is depicted. Data center room 200 is a room (enclosed, in one embodiment) that is cooled and/or heated by a heating, ventilation, and air conditioning (HVAC) system 201. The HVAC system 201 provides refrigerated (cooled) and/or heated air to the data center room 200 via a plurality of air outlets 203a-203n (where "n" is an integer). These air outlets 203a-203n are fixed registers/diffusers/vents in one embodiment, and/or are adjustable registers/diffusers/vents in another embodiment. In either embodiment, air outlets 203a-203n are air-fluidly connected to ductwork and a warm/cool air source (not depicted) within the HVAC system 201, thus allowing air that has been temperature adjusted to flow into the data center room 200. In one embodiment, the cool/heated air provided by the HVAC system 201 is distributed uniformly throughout the data center room 200. In another embodiment, the cool/heated air from the HVAC system 201 is unevenly channeled by adjusting the air outlets 203a-203n, such that one area/device within the data center room 200 receives more or less conditioned air than another area/device within the data center room 200.

As depicted, multiple computing devices are located within the data center room 200. In the illustrative example, there are multiple blade chasses within the data center room 200. These blade chasses are labeled as blade chassis 202x—blade chassis 202z (where "z" is an integer"). Within each of the blade chasses 202x-202z are one or more server blades, depicted as blades 204x-a to 204x-c in blade chassis 202x; as blades 204y-a to 204y-c in blade chassis 202y; and as blades 204z-a to 204z-c in blade chassis 202z. In one embodiment, each of the blades 204 is cooled by one or more fans. As depicted, a fan 208x-a is dedicated to cooling blade 204x-a; fan 208x-b is dedicated to cooling blade 204x-b; fan 208x-c is dedicated to cooling blade 204x-c; fan 208y-a is dedicated to cooling blade 204y-a; fan 208y-b is dedicated to cooling blade 204y-b; etc. Alternatively, a single fan 208 may cool multiple blades 204 and/or other electronic devices. For example, fan 208x-b may cool blade 204x-b as well as blade 204x-a and/or blade 204x-c within blade chassis 202x. In this example, fans 208x-a and/or 208x-c are either turned off, or else do not exist within blade chassis 202x.

As described herein, the present invention ensures that properly cooled (or alternatively, heated) air is provided to keep an electronic device within nominal operating temperatures, and thus within nominal (normal) operating conditions/abilities (e.g., does not "throttle" back one or more components within the electronic device). In order for the HVAC system 201 to determine whether a particular electronic or computing device is running at too high a temperature (e.g., a temperature that causes one or more components within the computing device to be throttled back), various electronic/computing devices are monitored, directly and/or indirectly, by a control agent 211 within the HVAC system 201.

For example, consider blade chasses 202x-202y. Exemplary blade chassis 202x includes a chassis management module (MM) 206x, which monitors and/or controls operations of fans 208x-a to 208x-c, as well as blades 204x-a to 204x-c. Assume now that chassis MM 206x detects that one or more of the blades 204x-a to 204x-c is operating at a temperature that will cause it/them to throttle back. That is, assume that blade 204x-b is designed to operate at between 10° F. and 130° F. Assume further that if the temperature of blade 204x-b exceeds 130° F., then the chassis MM 206x will "throttle" back operations within blade 204x-b. Examples of such throttling include, but are not limited to, decreasing the clock speed of a central processing unit (CPU) within blade 204x-b, slowing down data traffic to and from memory within blade 204x-b, limiting how much data traffic is allowed to travel on various internal and external busses within blade 204x-b, etc. By decreasing these operations within blade 204x-b, the temperature of blade 204x-b will decrease, but at the expense of a reduction in capacity/functionality for blade 204x-b.

One way to reduce a current temperature of a blade server such as blade 204x-b is to increase the amount of air that is blowing across it. Thus, fan 208x-b may be instructed by chassis MM 206x to speed up, thus increasing air flow. However, if the supply air (i.e., ambient air within the data center room 200) is not cold enough, then simply blowing more air is inefficient, if not ineffective (i.e., will not be enough to lower the temperature of blade 204x-b). The present invention thus provides a means to lower the temperature of the ambient air within the data center room 200.

Continuing to assume that exemplary blade 204x-b is running at a temperature above its throttle threshold temperature (i.e., the temperature that, if exceeded, will result in operations being curtailed/restricted/reduced within blade 204x-b), an electronic signal/message is sent from chassis MM 206x to control agent 211 informing control agent 211 that blade 204x-b is exceeding its throttle threshold temperature. In one embodiment, this signal results in control agent 211 sending a signal to thermostat 213, directing the thermostat 213 to direct the HVAC system 201 to reduce the temperature of all cooled air being supplied to the data center room 200 by the air outlets 203a-203b. In one/another embodiment, the signal from the chassis MM 206x results in control agent 211 sending a signal to a vent controller 215, which reduces the amount of cooling air coming out of all of the air outlets 203a-203n, except for air outlets 203a-203b, thus providing more localized ambient cold air around blade chassis 202x.

While the present invention may direct additional ambient cold air to a particular chassis 202 based on a particular blade 204 overheating, in one embodiment, additional ambient cold air is directed toward (i.e., aimed at) a particular chassis 202 based on one or more components of a blade 204 overheating. For example, consider exemplary blade 204z-a (from blades 204z-a to 204z-c). Within blade 204z-a is a CPU 212z-a, a memory 214z-b (e.g., a single in-line memory module (SIMM), a dual in-line memory module (DIMM), etc.), and a platform control hub (PCH) 216z-a (i.e., a chip that controls data paths, clocking, interfaces, etc.). Assume now that the memory 214z-a and PCH 216z-a are operating below their throttle threshold temperatures, but CPU 212z-a is approaching (or above) its throttle threshold temperature. In this example, blade management module 210a, which monitors and controls the hardware components within blade 204z-a, will send a signal to control agent 211, informing control agent 211 that colder air is needed around blade chassis 202z. Control agent 211 then sends a signal to thermostat 213 to reduce the temperature of air coming from HVAC system 201, and/or a signal to vent controller 215 to redirect more of the limited cold air supply from HVAC system 201 to the space around blade chassis 202z.

Figure 3:
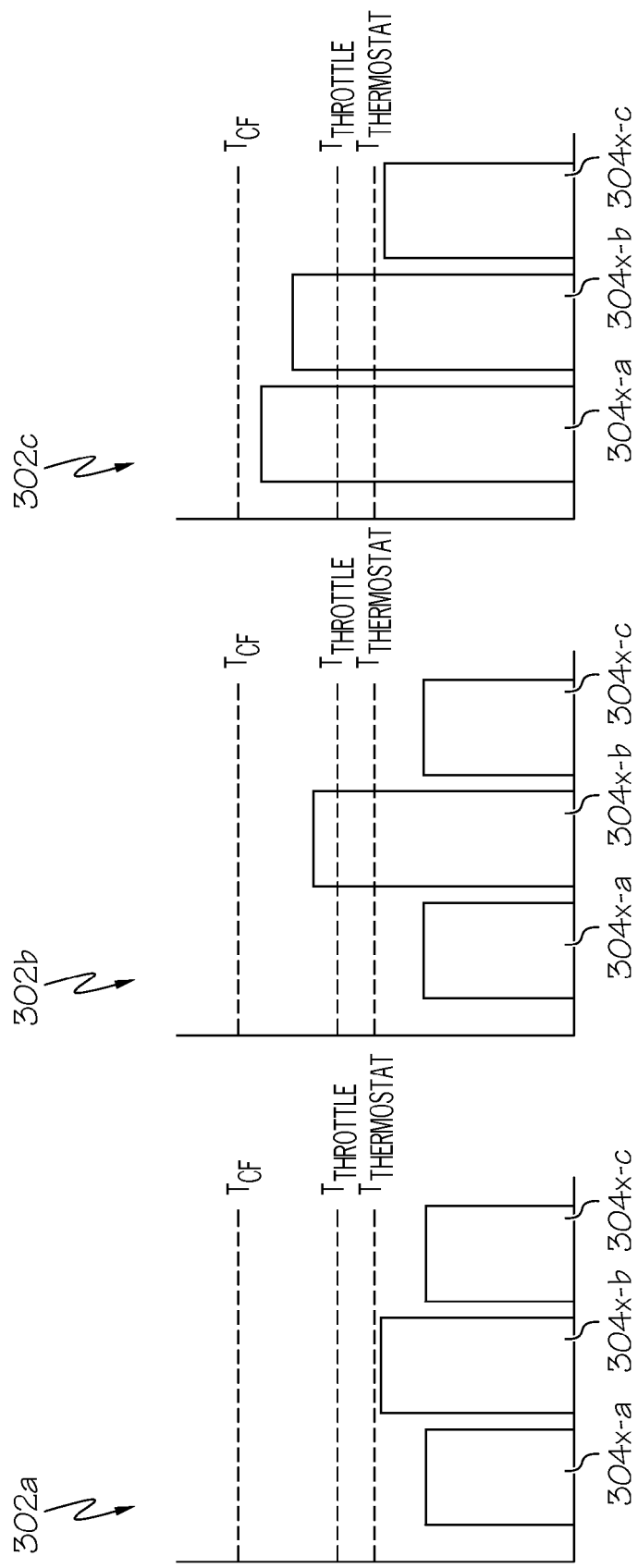
FIG. 3 illustrates exemplary graphs of different computing devices at various temperatures.

With reference now to FIG. 3, exemplary graphs 302a-302c of different computing devices at various temperatures are depicted. For example, consider graph 302a, in which components (e.g., electronic devices depicted in FIG. 2, including but not limited to chasses such as chasses 202x-202z; blades such as blades 204x-204z; blade components such as CPUs 212z-a to 212z-c, memories 214z-a to 214z-c, and PCHs 216z-a to 216z-c; etc.) are depicted at different temperatures.

For illustrative purposes, assume that each of the bars 304x-a to 304x-c in FIG. 3 represent current temperatures for different blades 204x to 204z in FIG. 2. For purposes of simplicity and clarity, assume that each of the blades 204x to 204z has a same throttle threshold temperature ($T_{Throttle}$) that, if exceeded, will result in the throttling back of functions within those blades 204x to 204z.

With reference now to graph 302a, blades 204x-a to 204x-c (represented by bars 304x-a to 304x-c) are all below their throttle threshold temperature $T_{Throttle}$. Thus, the current thermostat temperature setting ($T_{Thermostat}$) does not need to be adjusted.

In graph 302b, blade 204x-b (represented by bar 304x-b) is above its throttle threshold temperature $T_{Throttle}$. Thus, chassis MM 206x (depicted in FIG. 2) has two choices: (1) allow blade 204x-b to run hot and thus be throttled, or (2) direct control agent 211 to provide colder air to the space surrounding blade chassis 202x. Choice (1) is elected if the operations of blade 204x-b are deemed not critical by chassis MM 206x. For example, blade 204x-b may simply be a backup device, whose operations may be slowed down without affecting the overall function and efficiency of blade chassis 202x. Conversely, choice (2) is elected if the operations of blade 204x-b are deemed critical by chassis MM 206x. For example, blade 204x-b may be a device that controls medical life-support equipment, whose operations must never fall below nominal (normal) levels, or else a patient will be injured or killed.

In graph 302c, blades 204x-a and 204x-b (represented by bars 304x-b and 304x-b) are above their throttle threshold temperatures $T_{Throttle}$, but blade 204x-c (represented by bar 304x-c) is not. Again, chassis MM 206x has two choices: (1) allow blades 204x-a and 204x-b to run hot and thus be throttled, or (2) direct control agent 211 to provide colder air to the space surrounding blade chassis 202x.

Note that in all embodiments described in FIGS. 2-3, the chassis MM 206 and/or a blade MM 210 never allow the operating temperature of any of the blades 204 to reach a critical failure temperature ($T_{CF}$), at which a blade 204 will a) temporarily fail completely, and/or b) be permanently damaged. In another embodiment however, if a critical failure to a particular device is deemed acceptable by chassis MM 206 and/or a blade MM 210 in order to direct cold air to a more important device, conserve critically-low energy (e.g., emergency generator backup power), etc., then one or more devices may be allowed to operate at a critical failure temperature $T_{CF}$.

Again, the graphs 302a-302c in FIG. 3 may represent electronic and/or computing devices at a larger granularity level (e.g., each of graphs 302a-302c represent a different blade chassis 202 depicted in FIG. 2), or the graphs 302a-302c may represent electronic and/or computing devices at a smaller granularity level (e.g., each of the graphs 302a-302c represent a CPU 212, a memory 214, and a PCH 216 depicted in FIG. 2). In these embodiment, a chassis MM 206 and/or a blade MM 210 will selectively determine if colder air is needed to bring a device down below its throttle threshold temperature $T_{Throttle}$.

Note that while the throttle threshold temperature ($T_{Throttle}$) for all of the electronic devices described by the 304z-a to 304z-c are depicted as being the same temperature, in one embodiment these electronic devices have different throttle threshold temperatures. Thus, the temperature of supplied ambient cooling air being supplied is based on 1) the throttle threshold temperature of a particular electronic device that 2) is to be protected from having to throttle back its operations.

Figure 4:
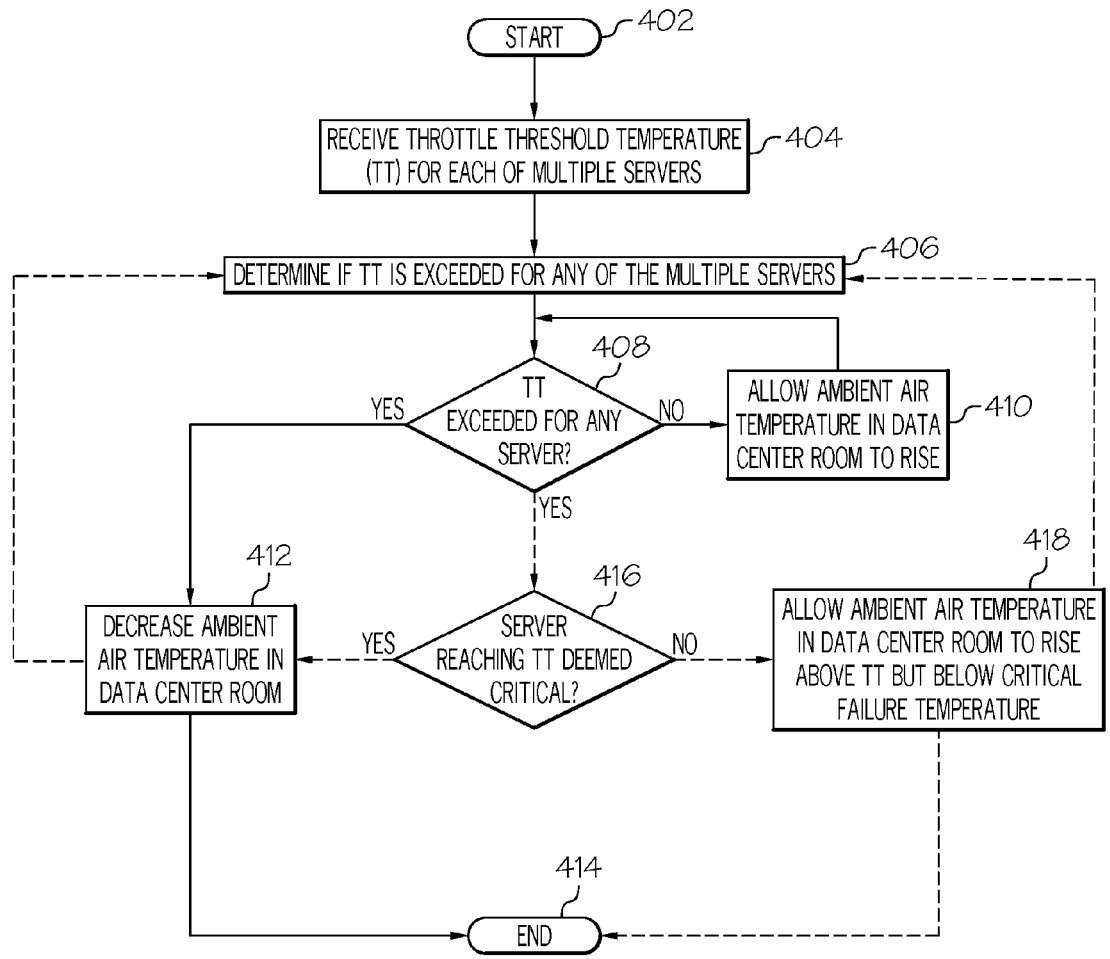
FIG. 4 is a high level flow chart of one or more exemplary steps taken by one or more processors to automatically adjust room temperature in a data center room.

With reference now to FIG. 4, a high level flow chart of one or more exemplary steps taken by one or more processors to automatically adjust room temperature in a data center room is presented. After initiator block 402, which may be prompted by a detection in a rise in overall room temperature in a data center room, a processor (e.g., a component of control agent 211 depicted in FIG. 2) in a heating, ventilation and air conditioning (HVAC) system receives a throttle threshold temperature for each of multiple computing devices, including but not limited to blade chassis, server blades, server components, etc. (block 404). As described in FIG. 2, the multiple computing devices are physically located within a data center room that is climate-controlled by the HVAC system, and the throttle threshold temperature is a temperature that, if exceeded, causes operations of one or more components of a computing device to be reduced (e.g., "throttled" back). In one embodiment, the throttle threshold temperature is provided by a hardware management module (MM) associated with at least one of the multiple computing devices. Examples depicted in FIG. 2 of such hardware MMs include the depicted chassis MMs 206x-206y and the blade MMs 210a-210c.

As described in block 406 in FIG. 4, the processor in the HVAC system (e.g., part of control agent 211) and/or a management module (e.g., chassis MMs 206x-206y and/or blade MMs 210a-210c) monitor the real-time temperature of at least one of the multiple computing devices in order to determine if any throttle threshold temperatures are being exceeded. As described herein, the real-time temperature is provided by the hardware MM associated with said at least one of the multiple computing devices. In one embodiment, the temperature is measured by a hardware thermometer (e.g., hardware thermometer 124 shown in FIG. 2) that is dedicated to measuring temperature. For example and in one embodiment, a temperature probe is part of a particular blade, blade chassis, blade component, etc., such that readings from the temperature probe are sent to the appropriate management module. In another embodiment, the temperature is detected from a secondary event, such as a fan increasing its speed. For example, fan 208*x-b* may contain, or be associated with, logic that speeds it up if local temperature (at the fan 208*x-b* and/or the blade 204*x-b*) rises above some predetermined level. This increased fan speed can be calibrated with a certain temperature, thus providing information about the temperature from the fan speed.

As described in query block 408 and block 410 of FIG. 4, if none of the monitored electronic devices are exceeding their throttle threshold temperatures, then the thermostat on the HVAC system is allowed to remain the same, or in order to save energy, go higher (block 410), thus allowing the room temperature of the data center room to rise. However, if one or more throttle threshold temperatures for various electronic devices have been reached (query block 408), then the air temperature in the data center room is lowered (block 412). That is, in response to the real-time temperature of said at least one of the multiple computing devices exceeding the throttle threshold temperature for said at least one of the multiple computing devices, an ambient air temperature in the data center room is decreased by adjusting a hardware thermostat in the HVAC system. The process thus ends at terminator block 414. (Note that, in practice, the process actually continues back up to block 406, as indicated by the dashed lines leading back up to block 406. Thus, the process of monitoring the temperatures of the servers, and actions taken thereupon, are continuous as long as the data center room is in use.)

As depicted by the dashed lines in FIG. 4, an alternative embodiment allows the system to determine if any of the affected electronic components are deemed critical (query block 416). If so, then the room temperature is lowered. If not, however, then ambient air temperature in the room is allowed to rise above the throttle threshold temperature, but (preferably) below the critical failure temperature (block 418). Thus, in this embodiment, the processor in the HVAC system identifies a critical computing device from the multiple computing devices, wherein the critical computing device has been predetermined to be critical to a mission, and wherein a throttle threshold temperature of the critical computing device is a first temperature. The processor in the HVAC system also identifies a non-critical computing device from the multiple computing devices, wherein the non-critical computing device has been predetermined to be non-critical to a mission, and wherein a throttle threshold temperature of the non-critical computing device is a second temperature that is lower than the first temperature. The ambient air temperature in the data center room is then selectively controlled such that the throttle threshold temperature for the critical computing device is not reached and the throttle threshold temperature for the non-critical computing device is exceeded.

In one embodiment of the present invention, air temperature is adjusted according to a throttling history of various components in the data center room. That is, in this embodiment, a throttling history (retrieved by a processor from an operations history database) of a critical device is evaluated (tracked). If that critical device has a history of throttling too often, then additional cold air is directed to the ambient space around that device's container. Thus, in this embodiment, the processor in the HVAC system identifies a critical computing device from the multiple computing devices, wherein the critical computing device has been predetermined to be critical to a mission, and wherein the critical computing device is mounted within a first containment device. The processor in the HVAC system also identifies a non-critical computing device from the multiple computing devices, wherein the critical computing device has been predetermined to be non-critical to a mission, and wherein the non-critical computing device is mounted within a second containment device. A throttling history of the critical computing device is tracked and/or retrieved. In response to the throttling history of the critical computing device exceeding a predetermined frequency, airflow from the HVAC system is adjusted to provide additional cooling air to a first area around the first containment device and a reduced amount of cooling air to a second area around the second containment device.

As described herein, in one embodiment of the present invention the multiple computing devices are all server chasses (i.e., a container with racks, server blades mounted on one or more of the racks, supporting devices such as power supplies, fans, etc.).

As described herein, in one embodiment of the present invention the multiple computing devices are all server blades.

As described herein, in one embodiment of the present invention the multiple computing devices are a combination of server chasses and individual servers.

As described herein, in one embodiment of the present invention the one or more components of a computing device comprise a processor, a memory, and a platform controller hub.

As described herein, the present invention addresses the ambient temperature requirements to properly cool computing devices. That is, the present invention provides a system and method for ensuring that ambient air (i.e., "supply air") is cool enough for optimal usage of cooling fans, ducts, plenum, etc. that are part of a computing device. Without a supply of cooling supply air, at the optimal temperature, such fans, etc. are unable to cool the computing devices/components to which they are dedicated. The present invention ensures that such optimally-cooled air is supplied.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of various embodiments of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Note further that any methods described in the present disclosure may be implemented through the use of a VHDL (VHSIC Hardware Description Language) program and a VHDL chip. VHDL is an exemplary design-entry language for Field Programmable Gate Arrays (FPGAs), Application Specific Integrated Circuits (ASICs), and other similar electronic devices. Thus, any software-implemented method described herein may be emulated by a hardware-based VHDL program, which is then applied to a VHDL chip, such as a FPGA.

Having thus described embodiments of the invention of the present application in detail and by reference to illustrative embodiments thereof, it will be apparent that modifications and variations are possible without departing from the scope of the invention defined in the appended claims.

What is claimed is:

1. A computer program product for automatically adjusting room temperature in a data center room, the computer program product comprising a computer readable storage medium having program code embodied therewith, the program code readable and executable by one or more processors to perform a method comprising:
    receiving, by a processor in a heating, ventilation and air conditioning (HVAC) system, a throttle threshold temperature for each of multiple computing devices, wherein the multiple computing devices are physically located within a data center room that is climate-controlled by the HVAC system, wherein the throttle threshold temperature is a temperature that, if exceeded, causes operations of one or more components of a computing device to be reduced, and wherein the throttle threshold temperature is provided by a hardware management module (MM) associated with at least one of the multiple computing devices;
    monitoring, by the processor in the HVAC system, a real-time temperature of at least one of the multiple computing devices, wherein the real-time temperature is provided by the hardware MM associated with said at least one of the multiple computing devices;
    in response to the real-time temperature of said at least one of the multiple computing devices exceeding the throttle threshold temperature for said at least one of the multiple computing devices, decreasing an ambient air temperature in the data center room by adjusting a hardware thermostat in the HVAC system;
    identifying, by the processor in the HVAC system, a critical computing device from the multiple computing devices, wherein the critical computing device has been predetermined to be critical to a mission;
    identifying, by the processor in the HVAC system, a non-critical computing device from the multiple computing devices, wherein the non-critical computing device has been predetermined to be non-critical to the mission; and
    prioritizing, for the mission, cooling of the critical computing device over the non-critical computing device, the prioritizing including controlling the ambient air temperature in the data center room based on the throttle threshold temperature for the critical computing device, or a throttling history of the critical computing device.

2. The computer program product of claim 1;
    wherein the throttle threshold temperature of the critical computing device is a first temperature;
    wherein the throttle threshold temperature of the non-critical computing device is a second temperature that is lower than the first temperature; and
    wherein the prioritizing comprises selectively controlling the ambient air temperature in the data center room such that the throttle threshold temperature for the critical computing device is not reached and the throttle threshold temperature for the non-critical computing device is exceeded.

3. The computer program product of claim 1;
    wherein the critical computing device is mounted within a first containment device;
    wherein the non-critical computing device is mounted within a second containment device;
    tracking the throttling history of the critical computing device; and
    wherein the prioritizing comprises, in response to the throttling history of the critical computing device exceeding a predetermined frequency, adjusting airflow from the HVAC system to provide additional cooling air to a first area around the first containment device and a reduced amount of cooling air to a second area around the second containment device.

4. The computer program product of claim 1, wherein the multiple computing devices are all server chasses.

5. The computer program product of claim 1, wherein the multiple computing devices are all server blades.

6. The computer program product of claim 1, wherein the multiple computing devices are a combination of server chasses and individual servers.

7. The computer program product of claim 1, wherein the one or more components of a computing device comprise a processor, a memory, and a platform controller hub.

8. A system comprising:
    a heating, ventilation and air conditioning (HVAC) system, wherein the HVAC system comprises:
        a hardware control agent for:
            receiving a throttle threshold temperature for each of multiple computing devices, wherein the multiple computing devices are physically located within a data center room that is climate-controlled by the HVAC system, wherein the throttle threshold temperature is a temperature that, if exceeded, causes operations of one or more components of a computing device to be reduced, and wherein the throttle threshold temperature is provided by a hardware management module (MM) associated with at least one of the multiple computing devices;

monitoring a real-time temperature of at least one of the multiple computing devices, wherein the real-time temperature is provided by the hardware MM associated with said at least one of the multiple computing devices;

a hardware thermostat, wherein the hardware thermostat, in response to the real-time temperature of said at least one of the multiple computing devices exceeding the throttle threshold temperature for said at least one of the multiple computing devices, decreases an ambient air temperature in the data center room by adjusting the HVAC system;

wherein the HVAC system identifies, by the hardware control agent, a critical computing device from the multiple computing devices, the critical computing device having been predetermined to be critical to a mission;

wherein the HVAC system identifies, by the hardware control agent, a non-critical computing device from the multiple computing devices, the non-critical computing device having been predetermined to be non-critical to the mission; and wherein the HVAC system prioritizes, for the mission, cooling of the critical computing device over the non-critical computing device, the prioritizing including controlling the ambient air temperature in the data center room based on the throttle threshold temperature for the critical computing device, or a throttling history of the critical computing device.

9. The system of claim 8:

wherein the throttle threshold temperature of the critical computing device is a first temperature;

wherein the throttle threshold temperature of the non-critical computing device is a second temperature that is lower than the first temperature; and wherein the HVAC system selectively controls, by the hardware thermostat, the ambient air temperature in the data center room such that the throttle threshold temperature for the critical computing device is not reached and the throttle threshold temperature for the non-critical computing device is exceeded.

10. The system of claim 8:

wherein the critical computing device is mounted within a first containment device;

wherein the non-critical computing device is mounted within a second containment device;

tracks, by the hardware control agent, a throttling history of the critical computing device; and wherein the HVAC system, in response to the throttling history of the critical computing device exceeding a predetermined frequency, adjusts, by mechanical airflow controllers, airflow from the HVAC system to provide additional cooling air to a first area around the first containment device and a reduced amount of cooling air to a second area around the second containment device.

11. The system of claim 8, wherein the multiple computing devices are all server chasses.

12. The system of claim 8, wherein the multiple computing devices are all server blades.

13. The system of claim 8, wherein the one or more components of a computing device comprise a processor, a memory, and a platform controller hub.

* * * * *